United States Patent [19]
Blake et al.

[11] Patent Number: 4,914,629
[45] Date of Patent: Apr. 3, 1990

[54] MEMORY CELL INCLUDING SINGLE EVENT UPSET RATE REDUCTION CIRCUITRY

[75] Inventors: Terence G. W. Blake, Dallas; Theodore W. Houston, Richardson, both of Tex.

[73] Assignee: Texas Instruments, Incorporated, Dallas, Tex.

[21] Appl. No.: 241,524

[22] Filed: Sep. 7, 1988

[51] Int. Cl.[4] .............................................. G11C 11/40
[52] U.S. Cl. .................................................. 365/154
[58] Field of Search ........................ 365/154, 156, 177

[56] References Cited

U.S. PATENT DOCUMENTS 4,725,981  2/1988  Rutledge ............................. 365/154
4,797,804  1/1989  Rockett, Jr. ........................ 365/154

OTHER PUBLICATIONS

"DMSP Dosimetry Data: A Space Measurement and Mapping of Upset Causing Phenomena", E. G. Gussenhower, et al., IEEE Trans. Nuclear Science, vol. NS-34, pp. 1251-1255 (1987).

"An SEU Tolerant Memory Cell Derived from Fundamental Studies of SEU Mechanisms in SRAM", H. T. Weaver, et al., IEEE Trans. Nuclear Science, vol. NS-34, pp. 1281-1286. (1987).

"Alpha Particle Induced Soft Errors in Dynamic Memories", T. C. May, et al., IEEE Trans. Electronic Devices, vol. ED-26, p. 2 (1979).

"CMOS RAM Cosmic Ray Induced Error Rate Analysis", J. C. Pickel, et al., IEEE Trans. on Nuclear Science, vol. NS-28, pp. 3962-3967 (1981).

Primary Examiner—James W. Moffitt
Attorney, Agent, or Firm—Stanton C. Braden; Rodney M. Anderson; Melvin Sharp

[57] ABSTRACT

The rate of single event upset in a memory cell is reduced by a pair of active devices in the cross-coupling between a pair of inverters. The active devices are controlled by voltages internal to the memory cell such that writing into the cell is not slowed significantly.

7 Claims, 5 Drawing Sheets

MEMORY CELL INCLUDING SINGLE EVENT UPSET RATE REDUCTION CIRCUITRY

FIELD OF THE INVENTION

This invention is in the field of integrated circuits and is specifically directed to static random access memories.

This invention was made with Government support under contract number AFWL/CSC S-408 awarded by United States Air Force.

BACKGROUND OF THE INVENTION

The susceptability of integrated circuit memories to soft error or SEU is of particular concern in space. See E. G. Muller, M. S. Gussenhower, K. A. Lynch and D. H. Brenteger, "DMSP Dosimetry Data A Space Measurement and Mapping of Upset Causing Phenomena". IEEE Trans. Nuclear Science NS-34, pp. 1251-1255 (1987) and H. T. Weaver, et al., "An SEU Tolerant Memory Cell Derived from Fundamental Studies of SEU Mechanisms in SRAM", IEEE Trans. Nuclear Science, NS-34, pp. 1281-1286 (1987). A soft error or single event upset (SEU) typically is caused by electron-hole pairs created by, and along the path of, a single energetic particle as it passes through an integrated circuit, such as a memory. Should the energetic particle generate the critical charge in the critical volume of a memory cell, then the logic state of the memory is upset. This critical charge, by definition, is the minimum amount of electrical charge required to change the logic state of the memory cell. The critical charge may also enter the memory through direct ionization from cosmic rays. See T. C. May and M. H. Woods, "Alpha Particle Induced Soft Errors in Dynamic Memories", IEEE Trans. Electronic Devices, ED-26, p. 2 (1979) and J. C. Pickel, J. T. Blaudfood, Jr., "CMOS RAM Cosmic Ray - Induced Error Rate Analysis" IEEE Trans. on Nuclear Science, Vol. NS-28, pp. 3962-3967 (1981). Alternatively, the critical charge may result from alpha particles (helium nuclei). One example of SEU can be seen in FIG. 1a which illustrates a cross-sectional view of a CMOS inverter. When alpha particle p strikes bulk semiconductor material in p-channel MOS transistor Pch, it generates electron-hole pairs as shown by the respective minus and plus marks. Assuming that n-channel transistor Nch is on and that p-channel transistor Pch is off, the holes which collect (see arrows toward drain D) at drain D can change the voltage at output OUT from a logic low to a logic high. The electrons as indicated by the minus signs will diffuse toward circuit supply voltage Vcc. A charge generating energetic particle hit on transistor Nch has the opposite effect with positive charges drifting towards ground and negative charges collecting at output OUT, thus possibly changing the logic state of the inverter.

Further background follows with reference to FIG. 1b which illustrates a schematic drawing of a conventional CMOS (complementary metal oxide semiconductor) static memory cell, typically used in a static random access memory (SRAM). (Note that the term metal used in the pharse metal oxide semiconductor is interpreted in semiconductor and related arts as also encompassing polycrystalline semiconductor material.) Memory cell 2 is constructed according to well known methods of cross-coupled inverter realization and thus CMOS inverters are used in memory cell 2. A first CMOS inverter 4 in memory cell 2 comprises p-channel transistor 6 and n-channel transistor 8 having their source-to-drain paths connected in series between Vcc and ground, and having their gates tied together. The second CMOS inverter 5 in memory cell 2 is similarly constructed, with p-channel transistor 10 and n-channel transistor 12 having their source-to-drain paths connected in series between Vcc and ground and their gates also common. The cross-coupling is accomplished by the gates of transistors 6 and 8 being connected to the drains of transistors 10 and 12 (node S1 of FIG. 1b), and by the gates of transistors 10 and 12 being connected to the drains of transistors 6 and 8 (node S2 of FIG. 1b). N-channel pass transistor 14 has its source-to-drain path connected between node S2 and a first bit line BL, and has its gate connected to work line WL. N-channel pass transistor 16 similarly has its source-to-drain path connected between node S1 and a second bit line BL__, and has its gate also connected to word line WL. Pass transistors 14, 16 when enabled, allow data to pass into and out of memory cell 2 from bit lines BL and BL__respectively. Bit lines BL and BL__carry data into and out of memory cell 2. Pass transistors 14, 16 are enabled by word line WL which is a function of the row address in an SRAM. The row address is decoded by a row decoder in the SRAM such that one out of n word lines is enabled, where n is the number of rows of memory cells in the memory which is a function of memory density and architecture.

In operation, the voltages of node S1 and S2 will necessarily be logical complements of one another, due to the cross-coupled nature of CMOS inverters 4, 5 within memory cell 2. When work line WL is energized by the row decoder (not shown)., according to the row address received at address inputs to an address buffer (not shown) connected to the row decoder, pass transistors 14 and 16 will be turned on, coupling nodes S1 and S2 to bit lines BL__and BL, respectively. Accordingly, when word line WL is high, the state of memory cell 2 can establish a differential voltage on BL and BL__. Alternatively, peripheral circuitry forcing a voltage on BL and BL__can alter the state of memory cell 2. The sizes of the transistors shown in FIG. 1b are generally chosen such that when pass transistors 14 and 16 are turned on by word line WL; a differentially low voltage at bit line BL with respect to node S2 can force node S2 to a logic low level; and a differentially low voltage at bit line BL__with respect to node S1 can force node S1 to a logic low level. However, the sizes of the transistors shown in FIG. 1b are also chosen such that when transistors 14 and 16 are on; a differentially high voltage at bit line BL with respect to node S2 will not force node S2 high; nor will a differentially high voltage at bit line BL__with respect to node S1 force node S1 high. Therefore writing into memory cell 2 is accomplished by pulling the desired bit line and thus the desired side of cell 2 at either node S1 or node S2 low, which in turn due to feedback paths in cell 2, causes the opposite side of cell 2 to have a logic high state.

One method for hardening a memory cell against SEU is by reducing the amount of charge generated by a given event. This is accomplished for example, by using a silicon film thinner than the collection depth in bulk material. For instance, a memory cell created on a thin film of semiconductor, such as in an SOI (silicon on insulator) device, is less susceptible to SEU than one created on bulk, semiconductor such as silicon because ionization charge along a path in an insulator is more likely to recombine than be collected compared to ionization charge created in a semiconductor.

Another way to reduce the susceptibility of a memory cell to upset is by increasing the critical charge of the cell.

A hardening scheme against SEU in static memory cells based on increasing the critical charge required to produce SEU is illustrated in the schematic drawing of FIG. 2a. As shown, resistors 18 and 20 are included in the cross-coupling lines of inverters 4 and 5 and they increase the RC time constant delay associated with the gate capacitances of transistors 6, 8 10, and 12. The initial effect of an energetic particle strike in a critical volume is to change the voltage of one node of the memory cell, say node S1. Upset will occur if this change in voltage propagates through the cross coupling of inverters 4 and 5 before the initial voltage of node S1 is restored. The increased RC delay slows the feedback propagation through the cross coupling and allows more time for recovery of the initially affected node. However, this increase in RC propagation delay also slows the write cycle time of cell 2. The write cycle of an SRAM has typically been faster than the read cycle so that some slowing of the write cycle has been acceptable, since the read cycle time was the most critical. However, with scaling of memory cells to small geometries, the speed of the write cycle of SEU hardened cells has become critical. Therefore, this resistive approach to SEU hardening is no longer desirable.

Another hardening scheme against SEU based on increasing the critical charge is to increase the capacitance on the inverter drains, thus decreasing the voltage change on the node for a given amount of collected charge. The effectiveness of the capacitance in increasing the critical charge for SEU is increased by having the capacitance between the drains of the two inverters, which, with the cross coupling, is the same as between the gate and drain of the same inverter, as shown in FIG. 2b. FIG. 2b illustrates the same circuit schematic as FIG. 1b with the exception that capacitor 21 is connected across the cross-coupling connections of inverters 4 and 5. By having the capacitance between the gate and drain of the inverter, the effect of the capacitance is increased by Miller capacitance. Also, with the capacitance from gate to drain, a change in the drain voltage induces a change in the gate voltage such that the restoring current is increased. Increased capacitance on the gate will also increase the RC delay in the feed back path, thus increasing resistance to SEU and also slowing the WRITE; however, so long as the resistance in the cross-coupling is small, this effect will be minimal. Thus, capacitor 21 can reduce the rate of SEU. However, two constraints must be met. First, capacitor 21 must be small in size in order to meet small circuit geometry requirements. Second, the capacitance of capacitor 21 must be maintained at a certain level in order to insure sufficient SEU hardening. As the level of memory density increases, the need is even heightened for increased capacitance within the small circuit geometry constraint.

OBJECTS OF THE INVENTION

It is an object of the invention to provide a new and improved memory cell. It is another object of the invention to provide a new and improved memory cell for use in a static random access memory.

It is still another object of the invention to provide a new and improved memory cell having increased hardness against single event upset.

SUMMARY OF THE INVENTION

The foregoing objects of the invention are accomplished by a memory cell including cross-coupled inverters comprising p-channel and n-channel inverter transistors. A pair of p-channel transistors are connected one each between the drain of one inverter and the gate of a second inverter. These p-channel transistors are gated by either source/drain of a transistor from the pair. In a stable state of the memory cell, one or the other of the two p-channel transistors in the cross coupling will be less strongly turned on, or more turned off, than the other. Leakage current or subthreshold current can maintain the cross coupling, or a depletion threshold voltage can be used such that both devices are conductive in a stable state. Since WRITE is accomplished by pulling the high side low, and since the p-channel transistor is more conductive with low gate voltage, the feed back loop to latch the new memory state is accomplished through the p-channel transistors in the cross coupling while they are in their more conductive state. Thus, only a small delay is introduced to the WRITE cycle.

DETAILED DESCRIPTION OF THE INVENTION

Figure 1A:
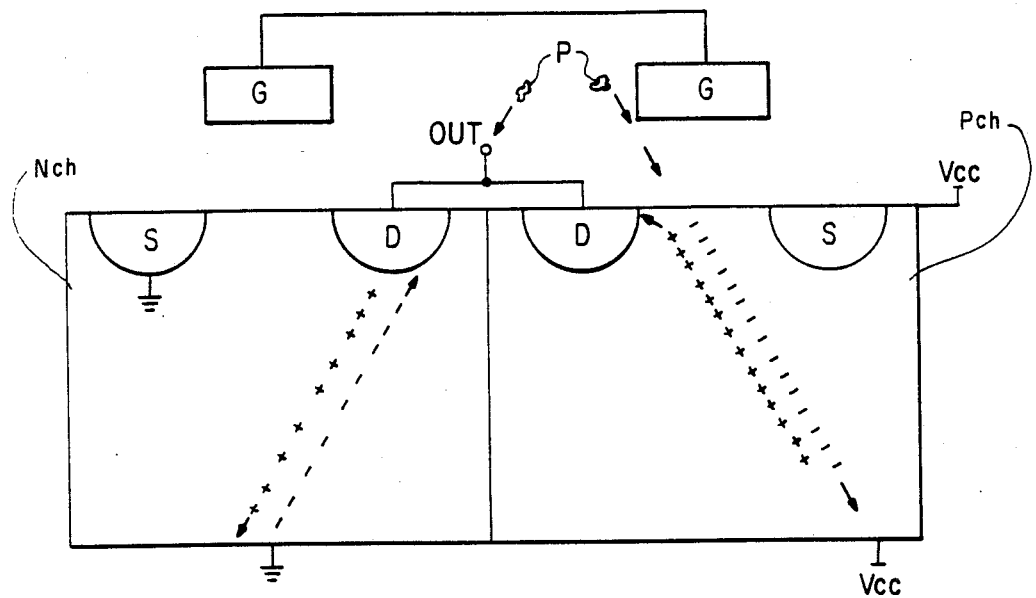
FIG. 1a is a cross-sectional view of a CMOS inverter.
Figure 1B:
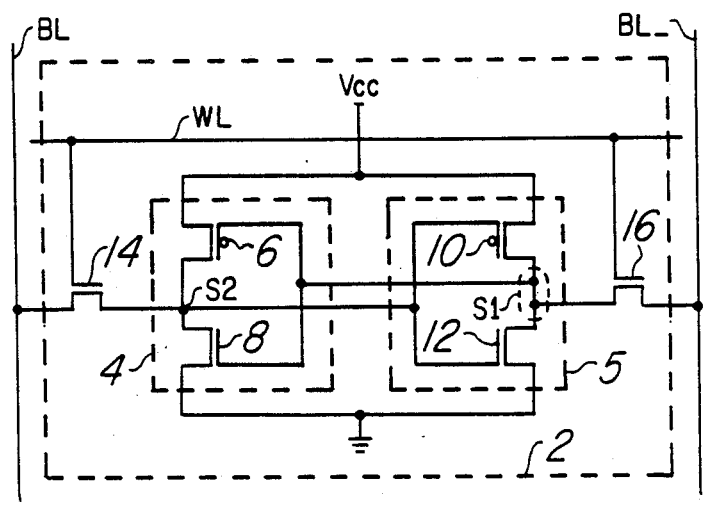
FIG. 1b is a schematic drawing of a conventional CMOS memory cell typically used in an SRAM.
Figure 2A:
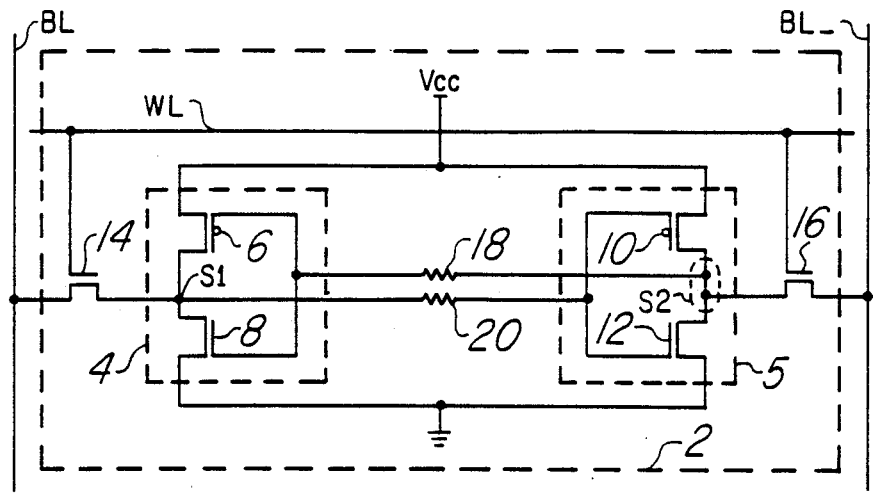
FIGS. 2a and 2b are schematic drawings of prior art SEU hardening schemes.
Figure 2B:
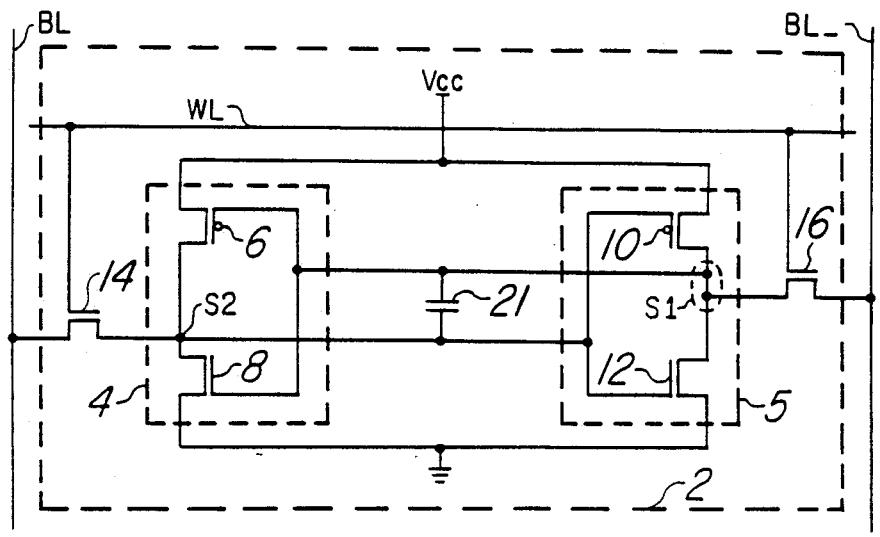
Figure 3A:
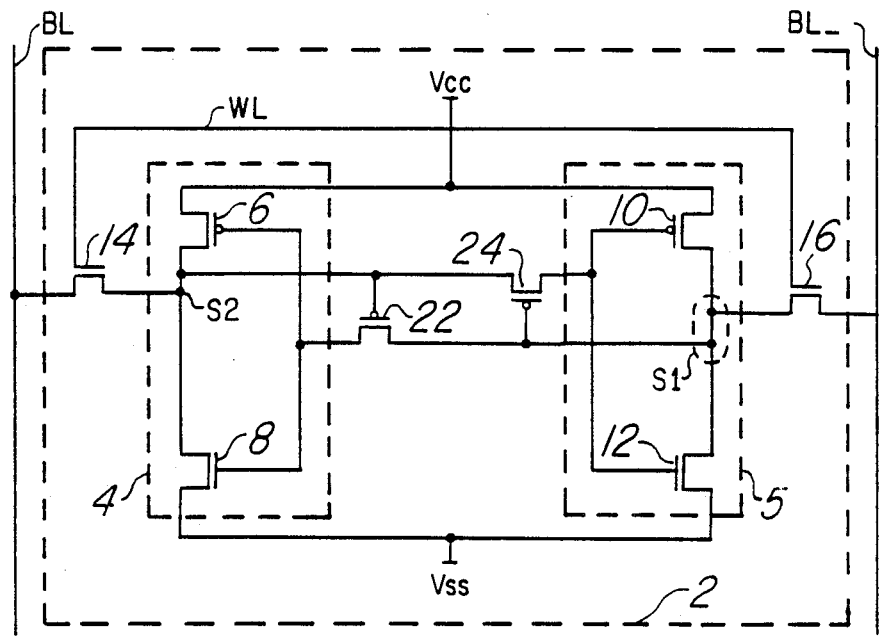
FIGS. 3a is a schematic drawing of a first preferred embodiment of the invention.

The invention places a pair of p-channel transistors (preferably metal oxide semiconductor (MOS) transistors in order to fit compactly and conserve space in a memory cell) in the cross coupling of a memory cell. A schematic drawing of an integrated circuit which includes a first embodiment of the invention is illustrated in FIG. 3a. Note that for optimum SEU hardness that this circuit is built on an insulator (although it can be built on bulk semiconductor material) and therefore can be classified as an SOI device. Particular benefit is obtained if at least the devices in the cross-coupling are isolated from the bulk as could be done with stacked polysilicon transistors. FIG. 3a illustrates the same circuit schematic as shown in FIG. 1b with the exception that p-channel transistors 22 and 24 are connected across an associated cross-coupling line joining a gate of one inverter to the drain of another. The gate of transistor 22 is connected to a source/drain of transistor 24 and the gate of transistor 24 is connected to the source/drain of transistor 22.

Demonstration of the operation of the circuit in FIG. 3a shall be shown by example. The p-channel nature of the depletion mode transistors 22, 24 increases their conductance with negative gate to source voltage and therefore the feedback mechanism for writing into the memory cell is not slowed significantly. For the case where node S1 is initially logic high and node S2 is initially logic low, when attempting to write the opposite state into memory cell 2, node S1 must first be pulled to logic low. This logic low transition must be transmitted through transistor 22 which is in its most turned on state, to the common gate of transistors 6 and 8. Node S2 then changes from its initial logic low state to a logic high state in response to a low voltage at the gates of transistors 6 and 8. However, the transition of node S2 from low to high is transmitted through transistor 24, the gate of which is now at a voltage causing transistor 24 to be in a higher conducting state (logic low). Note that while the WRITE is accomplished through transistors 22 and 24 in their most turned on state, the voltage maintaining feedback in memory cell 2 must always go through transistors 22 and 24, one of which is always in a lower conducting state (gate high). This feedback can alternatively be maintained by leakage or subthreshold current, meaning that enhancement mode transistors or depletion mode transistors can be used as transistors 22 and 24.

If transistors 6 or 10 are hit by a particle which changes the logic state at the output of an inverter, memory cell 2 is able to recover from the hit due to the added resistance provided in the cross-coupling by the resistive paths between source and drain regions of transistors 22 and 24 when each is in its lower conducting state. The effect of the added resistance increases the RC time constant delay, therefore preventing the negative effect of the SEU induced voltage change from propagating through memory 2. Because of the effect of the capacitance and the delay through the ON device, there will be substantial reduction of the SEU rate even for hits on the n-channel device. Therefore, the invention reduces the overall rate of SEU. An added advantage of this invention is that SEU rate reduction is provided without substantially effecting WRITE speed.

Figure 3B:
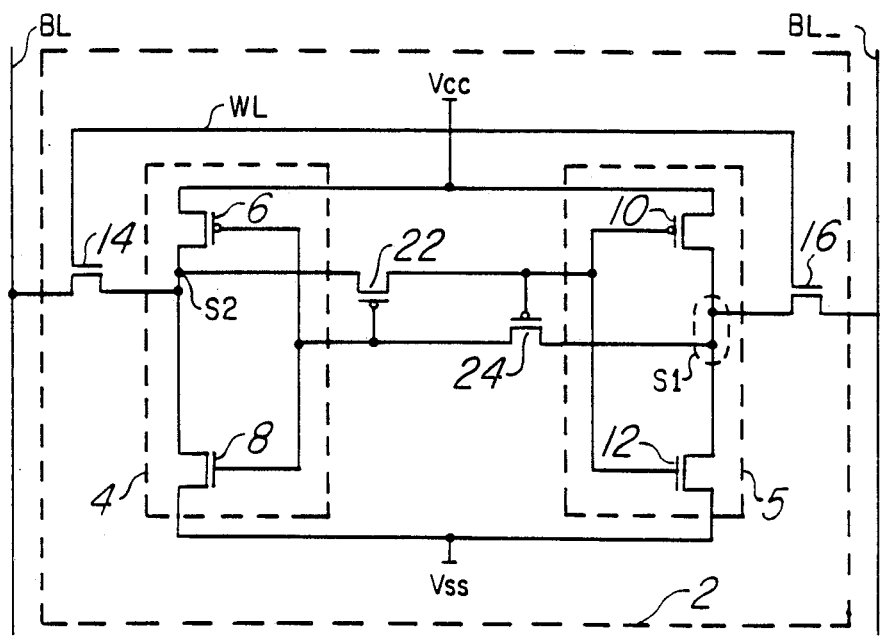
FIG. 3b is a schematic drawing of a second preferred embodiment of the invention.

FIG. 3b illustrates a schematic drawing of a second ebodiment of the invention. This circuit may be viewed as the same circuit shown in FIG. 3a with the transistors 22 and 24 exchanged in position and numerical label with one another. The discussion of the operation of the circuit in FIG. 3a applies completely to the operatoin of the circuit in FIG. 3b by substituting transistor labels "22" with "24" and "24" with "22".

Figure 3C:
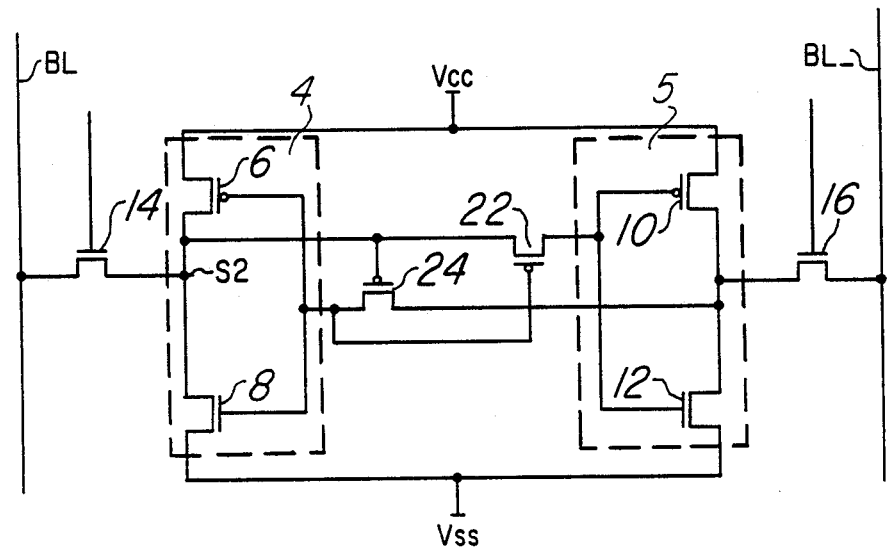
FIG. 3c is a schematic drawing of an alternative embodiment of the invention.

An alternative embodiment of the invention connects the gate of transistor 24 to the input of inverter 4 as illustrated in FIG. 3c.

Figure 4:
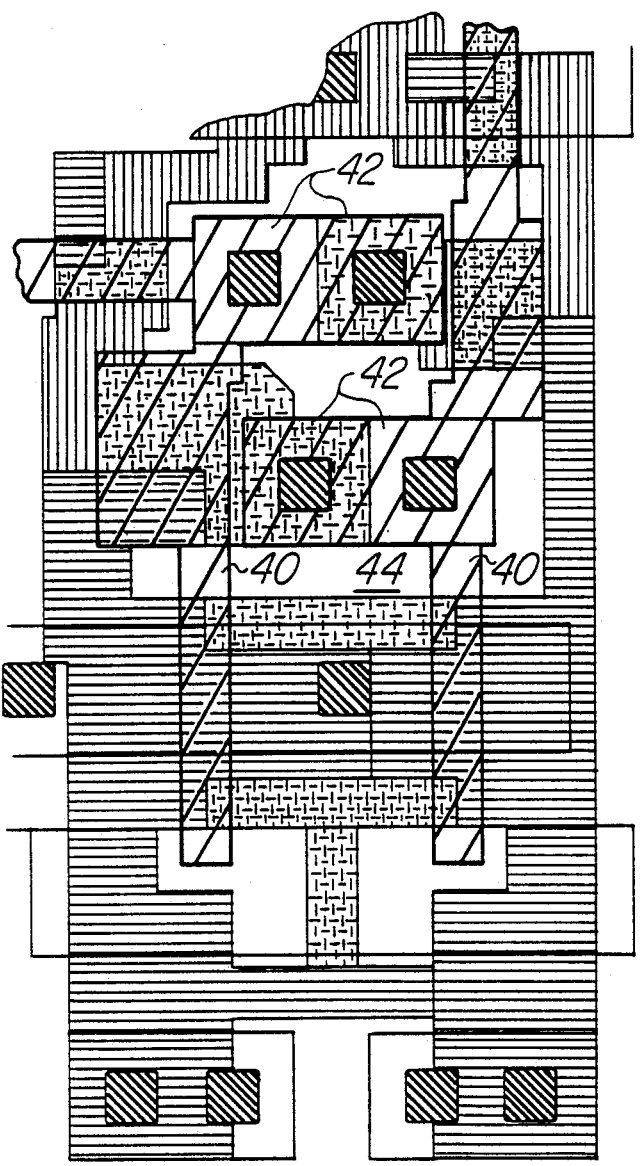
FIG. 4 illustrates a plurality of portions of superimposed photolithographic masks showing a possible layout of the invention.

FIG. 4 illustrates portions of superimposed photolithographic masks which give a layout scheme for constructing the foregoing described memory cell. Gate regions 40 (diagonally lines areas) are connected by straps 42 extending over moat region 44.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. N-channel transistors may be substituted for the previously discussed p-channel transistors 22 and 24 in the cross coupling especially as long as writing into the memory cell is accomplished by pulling the low node high. While the requirements for resistance to SEU have focused on memory cells, this invention also applies to reducing the SEU susceptibility of a single latch. Also, p-channel transistors may be substituted with n-channel transistors. Further, transistors may be connected to the cross-coupling of inverters of a variety other than the CMOS inverters illustrated in the foregoing drawings. It is contemplated that all such changes and additional embodiments are within the spirit and true scope of the invention as claimed below.

We claim:

1. A bi-stable logic device comprising:
a set of cross-coupled inverters, said set of inverters including first and second inverters; and
a pair of transistors connected to the cross-coupling of the inverters so as to provide a time delay in effecting voltage changes at selected nodes within the cell via an impedance path through said pair of transistors which lies between said selected nodes, the gate of a first transistor of said pair being connected to a first source/drain of a second transistor of said pair in addition to the gate of a second transistor of said pair being connected to a first source/drain of said first transistor.

2. A bi-stable logic device as recited in claim 1 wherein a second source/drain of said first transistor of said pair is connected to the input of said first inverter and wherein said first source/drain of said first transistor of said pair is connected to the output of said second inverter.

3. A bi-stable logic device as recited in claim 2 wherein said second source/drain of said second transistor of said pair is connected to said input of said second inverter and wherein said first source/drain of said second transistor of said pair is connected to said output of said first inverter.

4. A bi-stable logic device as recited in claim 1 wherein a second source/drain of said first transistor of said pair is connected to the output of said first inverter and wherein said first source/drain of said first transistor of said pair is connected to the input of said second inverter.

5. A bi-stable logic device as recited in claim 4 wherein a second source/drain of said second transistor is connected to said output of said second inverter and wherein said first source/drain of said second transistor of said pair is connected to said input of said first inverter.

6. A bi-stable logic device as recited in claim 1 wherein said field effect transistors are metal oxide semiconductor transistors.

7. A bi stable logic device as recited in claim 1 wherein each inverter includes a p-channel transistor and a n-channel transistor.

* * * * *